US007605054B2

(12) United States Patent
Celler

(10) Patent No.: US 7,605,054 B2
(45) Date of Patent: Oct. 20, 2009

(54) METHOD OF FORMING A DEVICE WAFER WITH RECYCLABLE SUPPORT

(75) Inventor: George K. Celler, Summit, NJ (US)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 159 days.

(21) Appl. No.: 11/736,809

(22) Filed: Apr. 18, 2007

(65) Prior Publication Data

US 2008/0261377 A1 Oct. 23, 2008

(51) Int. Cl.
*H01L 21/30* (2006.01)
(52) U.S. Cl. .............. 438/456; 438/455; 438/458; 438/459; 257/E21.088; 257/E21.122; 257/E21.567
(58) Field of Classification Search .............. 438/458, 438/464
See application file for complete search history.

(56) References Cited

U.S. PATENT DOCUMENTS

| 5,501,893 | A | 3/1996 | Laermer et al. ............ 428/161 |
| 5,854,514 | A | 12/1998 | Roldan et al. ............ 257/746 |
| 2003/0108715 | A1 | 6/2003 | Roberds et al. ............ 428/141 |
| 2004/0063322 | A1* | 4/2004 | Yang ............................ 438/689 |
| 2005/0029224 | A1 | 2/2005 | Aspar et al. ................... 216/33 |
| 2005/0148121 | A1 | 7/2005 | Yamazaki et al. ........... 438/149 |
| 2006/0199478 | A1* | 9/2006 | Isobe et al. .................... 451/54 |

FOREIGN PATENT DOCUMENTS

| FR | 2 823 596 A1 | 10/2002 |
| FR | 2 873 235 A1 | 1/2006 |
| WO | WO 03/060986 A2 | 7/2003 |
| WO | WO 2007/019478 A2 * | 2/2007 |
| WO | WO 2007/019487 A2 | 2/2007 |

OTHER PUBLICATIONS

Colinge et al., "Silicon layer transfer using wafer bonding and debonding", Journal of Electronic materials, vol. 30, No. 7, pp. 841-844, 2001.*
Tserepi et al., "Dry etching of porous silicon in high density plasma", physica status solidi (a) 197, No. 1, pp. 163-167, 2003.*
Tao et al., "Macro-porous silicon-based deep anisotropic etching", J. Micromach. and Microeng., 15, pp. 764-770, 2005.*
Tao et al. ("Macroporous silicon-based deep anisotropic etching", J. Micromech. and Microeng. 15, pp. 765-770, 2005).*
G.K. Celler et al., "Frontiers Of Silicon-On-Insulator", Journal of Applied Physics, vol. 93, No. 9, pp. 4955-4978 (2003).
Colinge et al., "Silicon Layer Transfer Using Wafer Bonding and Debonding," Journal of Electronic Materials, 30(7): 841-844 (2001).
International Search Report and Written Opinion of the International Searching Authority, application No. PCT/US2008/059643, dated Oct. 1, 2008.

* cited by examiner

*Primary Examiner*—Charles D. Garber
*Assistant Examiner*—Yasser A Abdelaziez
(74) *Attorney, Agent, or Firm*—Winston & Strawn LLP

(57) ABSTRACT

A method for forming a device wafer with a recyclable support by providing a wafer having first and second surfaces, with at least the first surface of the wafer comprising a semiconductor material that is suitable for receiving or forming electronic devices thereon, providing a supporting substrate having upper and lower surfaces, and providing the second surface of the wafer or the upper surface of the supporting substrate with void features in an amount sufficient to enable a connecting bond therebetween to form a construct wherein the bond is formed at an interface between the wafer and the substrate and is suitable to maintain the wafer and supporting substrate in association while forming or applying electronic devices to the first surface of the wafer, but which connecting bond is severable at the interface due to the void features to separate the substrate from the wafer so that the substrate can be reused.

32 Claims, 4 Drawing Sheets

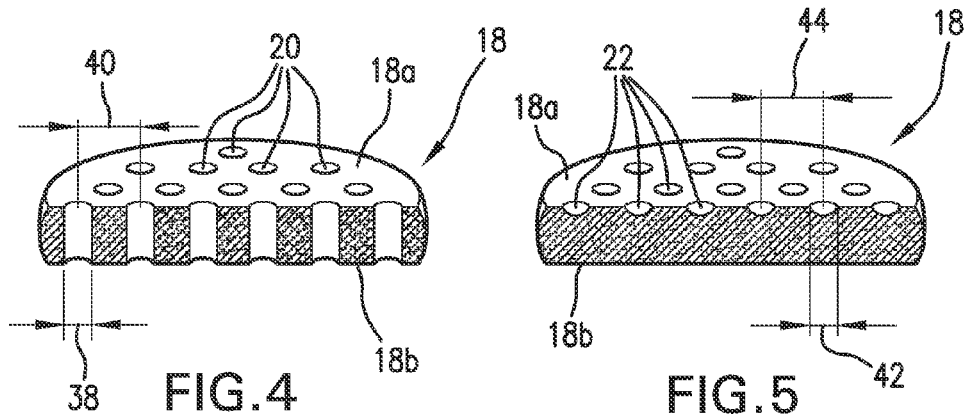
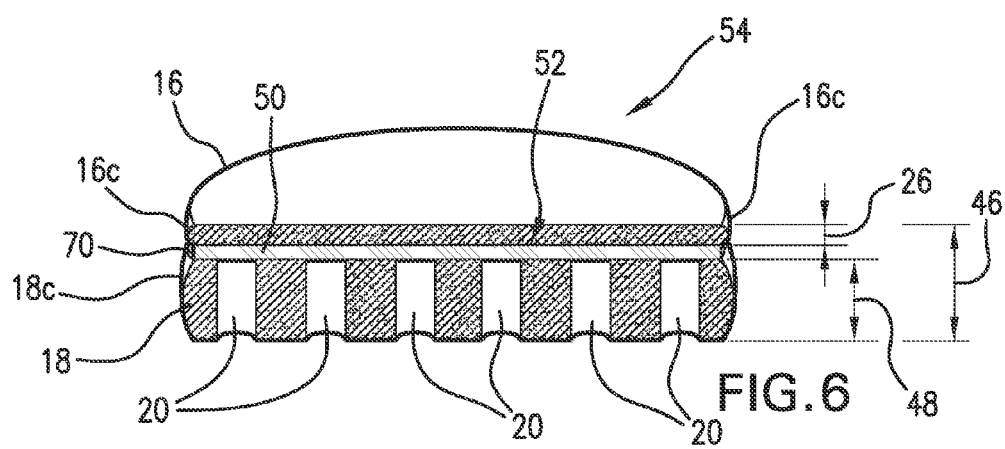
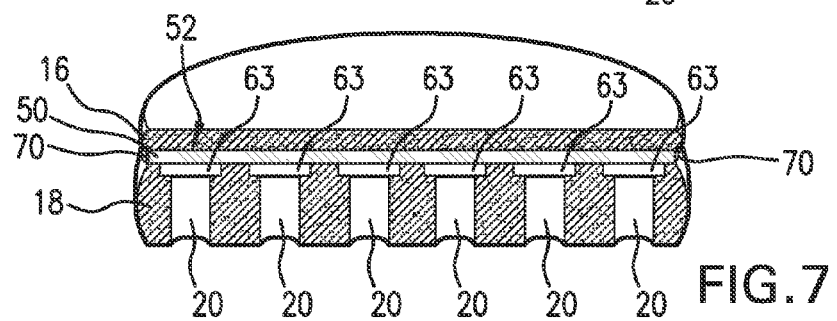
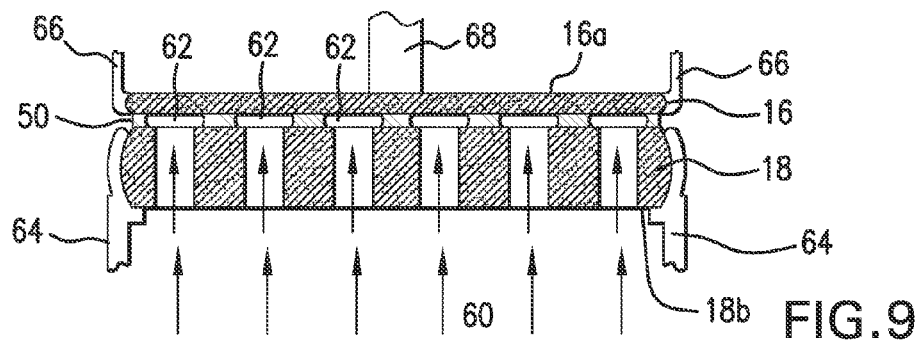

METHOD OF FORMING A DEVICE WAFER WITH RECYCLABLE SUPPORT

FIELD OF THE INVENTION

The present invention is directed to a method of forming a device wafer and, in particular, a method of attaching and separating a reusable supporting substrate to a wafer to form a device.

BACKGROUND OF THE INVENTION

Wafers are used as the base of integrated circuit chips. As wafers increase in size, the thickness of the wafers have been increased for mechanical stability of the wafer during device processing. For example, when producing a 200 mm wafer, the wafer thickness is about 725 microns and when producing a 300 mm wafer, the wafer thickness is about 775 microns. The increase in wafer size results in an increase in the amount of a silicon bulk material which is consumed for each usable wafer area. With wafers sizes approaching 450 mm, effective utilization of a single crystalline bulk material to produce the wafer is of critical importance, especially in view of the increasing expense of raw materials as well as increased competition for polysilicon from the photovoltaic industry.

In order to reduce the thickness of a wafer, standard device processing is usually finished by mechanically grinding of the back side of a wafer. This enables the thin layer to be as close as possible to the heat sink or other heat dissipation component of the wafer. The grinding step may be performed before separation/cutting the wafer into die and finalizing of individual devices. Grinding results in the loss of a significant amount (more than 50%) of silicon (i.e., silicon which is not included in the final integrated circuit chip).

In order to maintain the wafer on a supporting surface or substrate, it is necessary to have a bond which is strong enough to survive device fabrication but weak enough to be separated from the supporting surface without causing damage to the wafer or supporting substrate. Existing techniques for forming a weaker bond require that an SiO2 layer of the wafer may be chemical or dry plasma etched. Such etching results in roughness which would make the bond weaker than a perfectly smooth surface. If the surface, however, is too rough, the wafer may delaminate during device fabrication. For example, during a wet treatment step, liquid may flow at the level of the interface between the wafer and the supporting substrate and cause uncontrolled detachment/debonding during further process steps.

It is desirable to have a wafer which requires a minimal amount of material and which may be attached to and non-destructively removed from a supporting substrate that provides the required mechanical properties during device fabrication. In this way, the substrate may be conserved for reuse with other wafers to form further devices.

SUMMARY OF THE INVENTION

The invention relates to a method for forming a device wafer with a recyclable support which includes providing a wafer having first and second surfaces, with at least the first surface of the wafer comprising a semiconductor material that is suitable for receiving or forming electronic devices thereon. The method further comprises providing a supporting substrate having upper and lower surfaces, and providing the second surface of the wafer or the upper surface of the supporting substrate with void features in an amount sufficient to enable a connecting bond therebetween to form a construct wherein the bond is formed at an interface between the wafer and the substrate and is suitable to maintain the wafer and supporting substrate in association while forming or applying electronic devices to the first surface of the wafer, but which connecting bond is severable at the interface due to the void features to separate the substrate from the wafer so that the substrate can be reused.

In one embodiment, the voids are provided by forming a plurality of holes through the supporting substrate, wherein the plurality of holes are configured to receive at least one loosening agent therethrough for weakening the connecting bond between the wafer and the substrate at the interface. Generally, the holes have diameters between about 25 microns and about 100 microns and may be separated from each other by a distance of between about 100 microns and about 1 mm. The holes may be formed by selective etching of the substrate. Preferably, the selective etching includes dry etching.

The method may further include applying at least one loosening agent through the holes to weaken the connecting bond between the wafer and substrate. Preferably, the loosening agent is an acid or gas applied in a quantity sufficient to deteriorate the connecting bond to assist in the separation of the wafer from the substrate. In some embodiments, the method may include holding the construct and applying a pressure differential to the interface through the holes of the substrate in an amount sufficient to detach the wafer from the supporting substrate. For this embodiment, the supporting substrate can be coated with a thin layer of material after providing the holes therein to prevent premature loosening or separation during device fabrication. The coating can be removed by etching prior to applying the loosening agent.

In another embodiment, the void features are provided by forming depressions in the upper surface of the supporting substrate or on the second surface of the wafer prior to forming the connecting bond therebetween. Generally, the depressions are formed by etching.

The void features may be provided by forming bumps on the upper surface of the substrate or the second surface of the wafer prior to forming the connecting bond therebetween, with the void features comprising portions adjacent to the bumps. In one embodiment, the bumps are formed by epitaxial deposition, while in another embodiment the bumps are formed by oxidizing the second surface of the wafer or the upper surface of the supporting substrate.

The method may further include applying mechanical forces to pull apart and separate the wafer and supporting substrate. Preferably, the mechanical forces are applied by a mechanical device that includes a blade, or by a jet of gas or liquid. The method may further comprise positioning the wafer and substrate in a vacuum to further weaken the connecting bond between the wafer and the substrate at the interface.

In one embodiment, the method further includes forming or applying components on the first surface of the wafer to form electronic devices thereon prior to separating the wafer from the supporting substrate. Preferably, for this embodiment, the method further comprises separating the wafer from the substrate and, thereafter, cutting the wafer into a plurality of pieces. In some embodiments, the wafer is a SOI wafer.

In the preferred embodiment, the method further comprises separating the wafer from the supporting substrate for recycling and re-use for supporting another wafer, and further comprises removing oxides from the upper surface of the separated supporting substrate; reoxidizing that surface of the substrate to form void features thereon; and connecting the supporting substrate to another wafer.

BRIEF DESCRIPTION OF THE DRAWINGS

The present invention can be better understood by reference to the following drawings, wherein like references numerals represent like elements. The drawings are merely exemplary to illustrate certain features that can be used singularly or in combination with other features and the present invention should not be limited to the embodiments shown.

FIG. 4 is a cross-sectional view of an exemplary embodiment of a supporting substrate;

FIG. 5 is a cross-sectional view of an alternative exemplary embodiment of a supporting substrate;

FIG. 6 is a cross-sectional view of an exemplary embodiment of a wafer connected to an exemplary embodiment of a supporting substrate;

FIG. 7 is a cross-sectional view of an exemplary embodiment of a wafer connected to an alternative exemplary embodiment of a supporting substrate;

FIG. 9 is a cross-sectional view of the structure of FIG. 6 with a loosening agent acting thereon;

DETAILED DESCRIPTION OF THE PREFERRED EMBODIMENTS

The method of forming a device 14 (FIG. 11) may comprise providing a wafer 16 and a base or supporting substrate 18, and forming a feature 20, 22 (FIGS. 4, 5) in/through the supporting substrate 18 for separating the wafer 16 and the supporting substrate after processing the wafer. It should, however, be understood that those of ordinary skill in the art will recognize many modifications and substitutions which may be made to various steps for forming a device 14.

Figure 1:
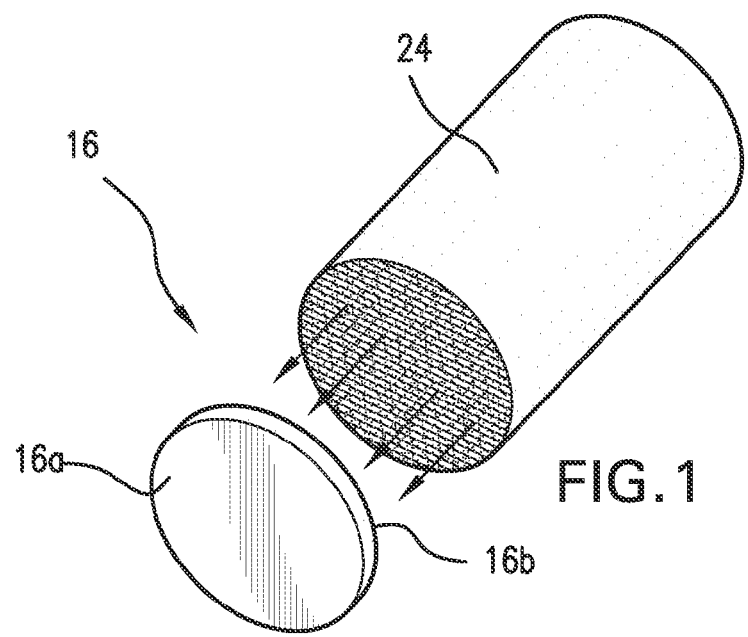
FIG. 1 is a perspective view of an exemplary embodiment of a wafer being separated from bulk material.

As shown in FIG. 1, one preferred method for obtaining a wafer 16, such as a bulk silicon wafer or a SOI (silicon on insulator) wafer, is to cut the wafer 16 from an ingot or bulk material 24. A wafer 16 is cut from the bulk material 24 using, for example, a wire impregnated with abrasives such as silicon carbide or an annular saw. The resultant wafer 16 may have a first surface 16a and a second surface 16b and may have a thickness 26 between about 100 microns to about 500 microns. While the wafer 16 is illustrated as a circular shape, it will be appreciated that wafer 16 may be any shape (e.g., ellipse, oval, square, rectangular, or other polygon). Furthermore, the wafer 16 can have a rounded edge or side 16c (FIG. 6).

Figure 2:
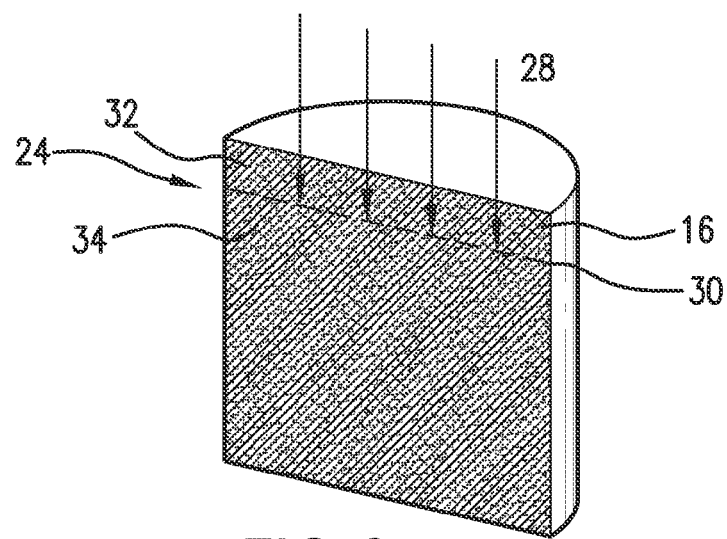
FIG. 2 is a cross-sectional view of an alternative exemplary embodiment of a wafer being separated from bulk material.

In another method, as illustrated in FIG. 2, a wafer 16 may be cut from the bulk material 24 using the SMART-CUT® method. The SMART-CUT® method is known per se to the skilled person (see, for example, G. Celler, Frontiers of Silicon-on-Insulator, Journal of Applied Physics, Vol. 93, no. 9, May 1, 2003, pages 4955-4978), and is incorporated herein by reference. In order to obtain a wafer 16 from a bulk material 24 using the SMART-CUT® method, atomic species 28 may be implanted into the bulk material 24. For example, as shown in FIG. 2, helium and/or hydrogen may be implanted in the bulk material 24, thereby forming a zone of weakness 30. The bulk material 24 then has a first portion 32 above the zone of weakness 30 and a second portion 34 below the zone of weakness 30. In order to separate the first and second portion 32 and 34, the bulk material 24 is molecularly bonded to a stiffener or handle substrate of an insulator material. To further fragilize the zone of weakness, the bonded components may be heat treated by annealing. Once heat treatment is completed, the first portion 32 is separated from the second portion 34 at the zone of weakness 30, thereby transferring the first portion of the bulk material to the stiffener or handle substrate to thus form a silicon on insulator (SOI) wafer 16 for use as the starting material.

The SMART-CUT® process can be used in the present invention with the only difference being that the handle substrate in the SOI wafer (the region below the buried oxide or BOX) should be thinner than usual, for instance 100 to 400 microns instead of 775 in a typical 300 mm SOI. Fabrication of these thin SOI wafers would consume less silicon than in a conventional case, and this would lead to a reduction in the amount of silicon in the handle substrate or stiffener.

Figure 3:
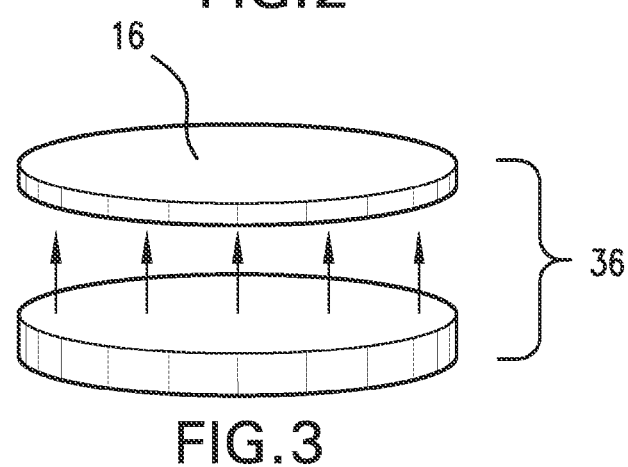
FIG. 3 is a perspective view of another exemplary embodiment of a wafer being separated from a starter wafer.

It should be noted that a wafer 16 can be cut from a thicker, starting wafer 36. Multiple wafers could then be made out of a single one for economy and conservation of silicon material. For example, as shown in FIG. 3, a 300 mm wafers having a thickness of 775 microns or a planned 450 mm wafer anticipated to have a thickness of 800+ microns can be starting wafers 36 which are cut to obtain a wafer 16 having a thickness 26 of between about 100 microns and about 500 microns. It will be appreciated, however, that a wafer 16 may be cut by any method from a starting wafer or a bulk material.

Similar to the wafer 16, the supporting substrate 18 may also be cut from a bulk material by, for example, wires or saws as noted above The supporting substrate 18 can have an upper surface 18a and a lower surface 18b and may be made of, for example, silicon carbide or polycrystalline silicon. Those of ordinary skill in the art will appreciate that other materials can be used, however, it is preferred that the supporting substrate 18 has thermal properties (e.g., a thermal expansion coefficient, a heat dissipation property, etc.) which are similar to the wafer 16. In this way, when heated during processing, the wafer 16 and supporting substrate 18 expand and/or contract at the same/similar rates, thereby preventing damage to the wafer 16 or supporting substrate 18 and/or premature separation (e.g., before processing is completed) of the wafer 16 from the supporting substrate 18. In addition, the supporting substrate 18 can be made of a material that does not contaminate the wafer 16 (e.g., one that does not release material or particles into the wafer 16).

The substrate 18 is preferably circular, but can be any suitable shape and may be the same or different size or shape as the wafer 16. Furthermore, the supporting substrate can have a rounded edge or side 18c (FIG. 6). In one embodiment, as shown in FIG. 4, a feature such as one or more holes 20 (e.g., an array of holes 20) may be formed through the supporting substrate 18 from the upper surface 18a to the lower surface 18b. These holes can be formed by a variety of processes, with dry etching methods such as, for example, the Bosch process, preferred for forming the holes 20 through the supporting substrate 18.

The Bosch process is described in U.S. Pat. No. 5,501,893 to Laermer et al., which is incorporated herein by reference thereto. The Bosch process involves alternating etch and deposition steps, in an inductively coupled reactive ion etching system. The etch part of the cycle typically produces etching to a depth of 2 to 3 µm of a silicon substrate per etching step, and uses, for example, a mixture of sulfur hexafluoride SF2 and argon Ar. In the deposition step, a mixture of, for example, trifluoromethane CHF3 and argon Ar, is used to generally deposit a 50 nm thick Teflon-like polymer layer on the side walls or on the etching base of the silicon substrate. During the following etching step, the side walls of the structure to be etched in remain protected by the polymer applied during the deposition step, as positively-charged cations are accelerated toward the silicon substrate by means of the electric prestress, and fall nearly vertically onto the substrate surface. The repetitive alternation of the etch and deposition steps results in an anisotropic etching at rates of between 2 to 20 µm/min, depending on the recipe and machine. This process is particularly useful in etching high aspect ratio holes at high etching rate and these are eminently suitable for use in the present invention.

In particular, holes 20 may be formed by dry plasma etching. Each hole 20 may have a dimension 38 of between about 25 microns and about 100 microns and the holes 20 may be a distance 40 apart of between about 100 microns to 1 mm. Stated another way, the holes 20 can cover between about 0.05% and about 5% of the surface area of the supporting substrate 18. Any size hole 20 and spacing of holes 20, however, is envisioned so long as the holes 20 can be used to separate the wafer 16 and the supporting substrate 18 (for example, so that a liquid (e.g., a loosening agent such as acid) and/or gas (e.g., pressurized air) may pass therethrough) as will be described herein. Preferably, the holes do not overlap or form a honeycomb type structure.

In another embodiment, as shown in FIG. 5, a surface feature 22 (e.g., one or more dimples or shallow depressions) may be formed on the upper surface 18a of a supporting substrate 18 so as to reduce surface contact. Each surface feature 22 may have a dimension 42 of between about 5 microns and about 100 microns and the surface features 22 may be a distance 44 apart of between about 10 microns to 0.5 mm) so that the surface features can cover between about 1% and about 50% of the surface area of the supporting substrate 18. The surface features may be in the form of "bumps" with the number of bumps not being too excessive to cause loss of strength so that the construct cannot withstand conventional processing. Such a configuration reduces the surface area of the supporting substrate 18 which is connected/bonded to the wafer 16, thus resulting in a bond between the wafer 16 and supporting substrate 18 that is weaker than the bond that would have been formed had there been no such bumps or surface features 22. The surface feature 22 may be formed by lithography and/or wet silicon (Si) etching. In such an embodiment, bonding of the wafer 16 to the supporting substrate 18 may be performed in a vacuum or at a reduced pressure.

In another embodiment, instead of forming surface features 22 in the supporting substrate 18, a substance such as acid may be used to etch or remove a portion of the layer (e.g., oxide layer) bonding the wafer 16 and the supporting substrate 18. This is done before bonding so that a roughened surface is provided. Such etching or removal may have the same effect as the surface features 22, reducing the surface area of the supporting substrate 18 which is connected/bonded to the wafer 16.

Figure 13:
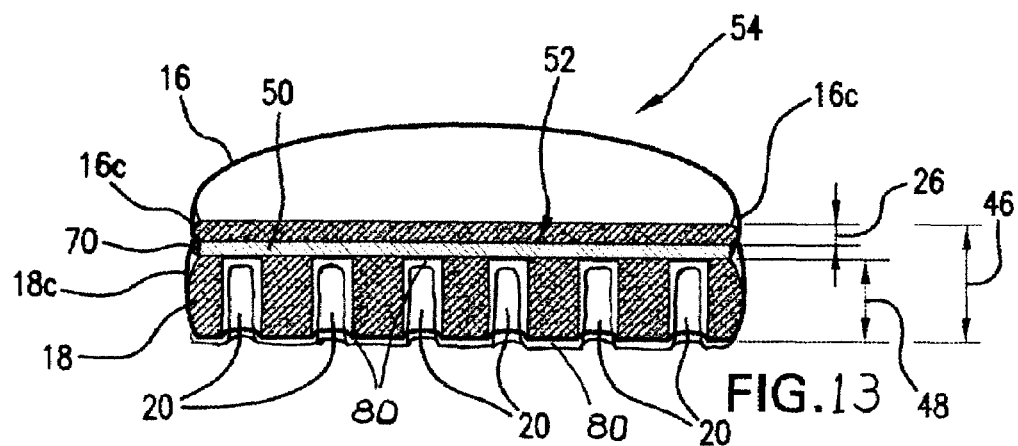
FIG. 13 is a cross-sectional view of an exemplary embodiment of a wafer connected to an exemplary embodiment of a supporting substrate with the walls and bottom of the holes coated with a thin layer of material.
Figure 14:
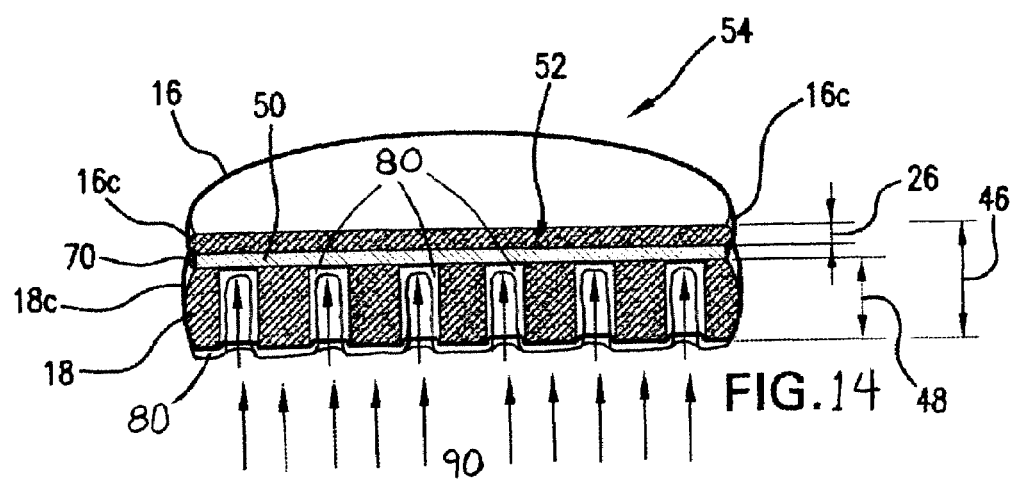
FIG. 14 is a cross-sectional view of the structure of FIG. 13 with a thin layer of material coated on the walls and bottom of the holes being removed by wet or dry etch steps.
Figure 15:
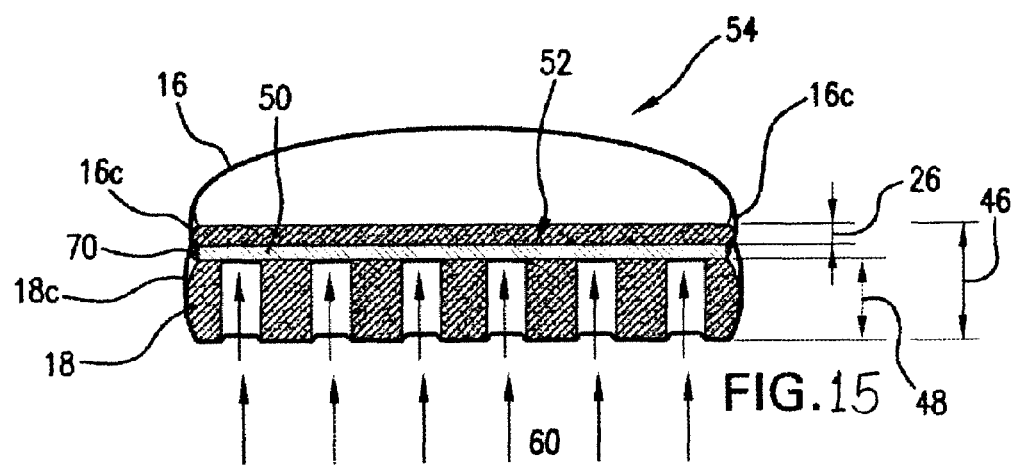
FIG. 15 is a cross-sectional view of the structure of FIG. 13 with a loosening agent acting thereon, after removing the thin layer of material by wet or dry etch steps.

While only a limited number of holes and surface features 20, 22 are illustrated in FIGS. 4, 5, 6, 7 and 9, those skilled in the art will recognize that there will considerably more holes or surface features 20, 22 than are shown. Moreover, while the holes and surface features 20, 22 are shown as having a circular cross section, the holes and surface features 20, 22 may be any shape such as, for example, oval or polygonal. In one embodiment, the surface features 22 can be elongated slots or depressions (not shown) extending partially along the upper surface 18a of the supporting substrate 18. In another embodiment, the elongated slots may extend along substantially the entire length of the upper surface 18a. Optionally, the slots can intersect at least one edge or side 18c, but they generally will be formed to not intersect. The lower surface of the substrate and the walls and bottom of the holes 20 may be coated with a thin layer of material 80 after bonding the wafer, as shown in FIGS. 13 and 14, so that the bond interface is better protected from premature loosening during device fabrication in the wafer. When separation of the substrate from the wafer is intended, a wet or dry etch steps 90 would then precede the application of the loosening agent 60, as shown in FIGS. 14 and 15. For example, a coating of less than 1 micron of polycrystalline or amorphous silicon would protect oxide at the bond interface from damage during device fabrication. Even without intentional coating, some deposits may form in the holes 20 during processing that would require wet or dry etching 90 before application of the loosening agent 60.

In a preferred embodiment, as shown in FIG. 6, the wafer 16 may be connected/bonded to a supporting substrate 18 prior to separating the wafer 16 therefrom. Connecting/bonding the wafer 16 to the supporting substrate 18 permits proper wafer handling throughout the entire process of forming a device 14. In a preferred embodiment, by using the method described herein, the thickness 46 of the wafer 16 and supporting substrate 18 may be equal to or less than the thickness of current wafers by itself. For example, when attached the wafer 16 and supporting substrate 18 may have a thickness 46 of about 650 to 1000 microns and approximately 725 microns for a 200 mm wafer, 775 microns for a 300 mm wafer or approximately 800 or more microns for the anticipated 450 mm wafer. As such, the thickness 48 of the supporting substrate 18 will vary depending on the thickness 26 of the wafer 16. The wafers generally have a thickness of between 150 and 350 microns, and the supporting substrate would have a thickness of between 300 and 850 microns. For example, when the wafer 16 is a 300 mm wafer and has a thickness 26 of about 200 microns, the supporting substrate 18 has a thickness of about 575 microns. In this example, the total thickness 46 is about 775 microns. The same size relationships are true when the wafer is an SOI wafer. The total thickness 46 may be any thickness so long as the combined wafer 16 and supporting substrate 18 can withstand processing without breaking or being damaged. Another factor which may be important for determining total thickness 46 is the ability of the combined wafer 16 and supporting substrate 18 to be held in machines which are configured to process standard wafer sizes. The skilled artisan can select the best combination of thicknesses for a particular application.

In another embodiment, a supporting substrate 18 having an array of holes 20 may be used to temporarily support a layer of material adapted for epitaxial deposition. After epitaxial deposition, the supporting substrate 18, the layer and the deposited epitaxial layer may be bonded to a final support. Thereafter, the supporting substrate 18 may be detached and reused. In yet other embodiments, the supporting substrate 18 can be used only for intermediate steps performed on the first surface 16*a* of the wafer 16 in processing a wafer 16 (e.g., epitaxial deposition, bonding of other layers, etching, etc.) rather than being used through the entire processing of the wafer 16.

Using a wafer 16 bonded to a supporting substrate 18 may provide significant advantages over using a standard size wafer (e.g., 200 mm/725 microns or 300 mm/775 microns). For example, during processing a standard 300 mm wafer having a starting thickness of 775 microns, may be thinned down or reduced by about 50% to 75% using, for example, a grinding wheel. A significant amount of material is essentially wasted or thrown away during processing. Starting with a wafer 16 with a thickness 26 which is less than a standard thickness (e.g., 775 microns) enables more of the starting wafer or bulk material to be conserved. Moreover, since the wafer 16 is bonded to the supporting substrate 18 and forms a structure having a thickness which is substantially the same as the thickness of a standard wafer, the resultant structure is capable of being processed in machines designed to hold standard wafers.

Various methods may be used in order to form a bond between the wafer 16 and the supporting substrate 18. The bond should be strong enough to prevent damage to/fracture of the wafer 16 during fabrication/processing of a device 14 but weak enough so that the wafer 16 can be separated from the supporting substrate 18 at the end of a fabrication/processing sequence of a device 14. It should be noted that, in some methods, it may be desirable for the bond to be weak enough so that the wafer 16 can be separated from the supporting substrate 18 at some point during the fabrication/processing sequence. In a preferred embodiment, bond may be accomplished by depositing an oxide 50 onto at least a portion of the surface of the wafer 16 and/or supporting substrate 18. In particular, the oxide 50 may be formed by being grown or deposited on the second surface 16*b* of the wafer 16 and/or the upper surface 18*a* of the supporting substrate 18. In this way, the oxide 50 can be positioned between the wafer 16 and supporting substrate 18 to form an interface 52, therefore, forming a resultant structure 54. A strong bond can be formed between the wafer 16 and the supporting substrate 18 by annealing/heating the oxide at a high temperature and a weaker bond can be formed by using a lower temperature. In a preferred embodiment, temperatures that are generally between about 400° C. and about 1200° C. are used for bonding. In one embodiment, before bonding the wafer 16 and supporting substrate 18, at least a portion of the resultant structure 54 may be coated with a material which may assist in bonding the wafer 1 and the substrate 2.

Figure 8:
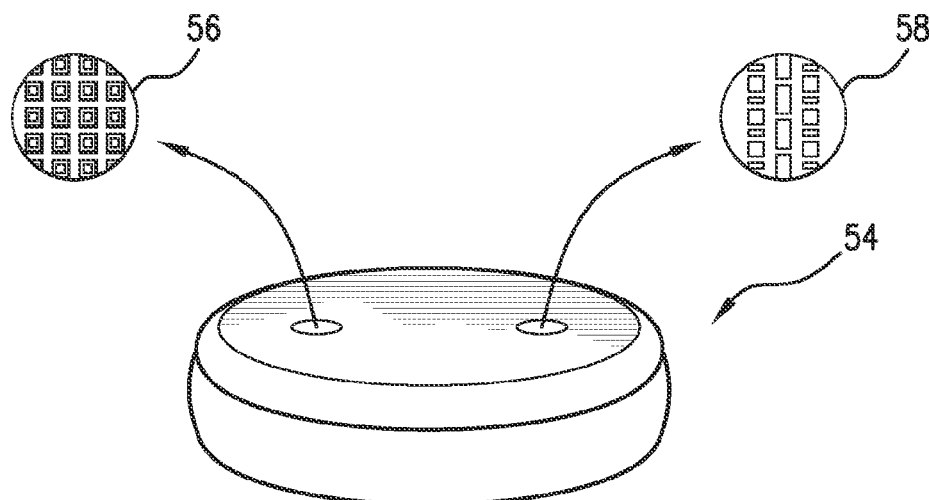
FIG. 8 is a perspective view of an exemplary embodiment of a processed wafer having components formed thereon.

The resultant structure 54 may subsequently be processed to make devices (e.g., circuit chips) as known by those skilled in the art. The material of the wafer, whether for the entire thickness or just for the thin useful layer in the case of a SOI wafer, is a semiconductor material that is suitable for forming such devices. For example, as illustrated in FIG. 8, a plurality of components 56, 58 can be fabricated by conventional methods in the wafer 16.

After the resultant structure 54 is processed, in a preferred embodiment, as illustrated in FIG. 9, an amount of at least one loosening agent 60 such as an acid (e.g., hydrofluoric acid (HF)), pressurized acid, or gas (e.g., pressurized air) can be applied to the lower surface 18*b* of the supporting substrate 18 (i.e., the portion of the substrate 18 which does not contact the wafer 16). The first surface 16*a* of the wafer 16 (i.e., the surface of the wafer 16 which is not positioned against the supporting substrate 18) may be protected from the loosening agent 60 by any means known to those skilled in the art (e.g., by applying a protective coating on the surface 16*a* or sealing the surface in a chamber (not shown)). The loosening agent 60 may penetrate through one or more holes 20 of the supporting substrate 18 and may flow to the interface 52 between the wafer 16 and the supporting substrate 18.

In an embodiment where the loosening agent 60 is acid and an oxide 50 is used for bonding, the loosening agent 60 may partially remove the oxide 50 to form voids or weakened areas 62. This may result in a reduction in the bond strength per unit area at the interface 52. Moreover, etching with acid may be performed over a long period of time so that enough oxide 50 is removed to enable the wafer 16 to be separated from the supporting substrate 18 without using any further loosening agent 60 such as pressurized air.

With the bond weakened, the wafer 16 and supporting substrate 18 can be separated by various means. In a preferred embodiment, as shown in FIG. 9, after etching is performed, a second loosening agent 60 such as pressurized gas (e.g., high pressure air) may be passed through the holes 20 to provide the additional force needed to separate the wafer 16 from the supporting substrate 18. The wafer 16 and/or substrate 18 may be held by the fixture at at least one edge or side 16*c*, 18*c*. When using pressurized air, the wafer 16 and/or supporting substrate 18 may be held by a fixture 64, 66, respectively (e.g., a circular fixture) which may fit tightly around the edges or sides 16*c*, 18*c* of the wafer 16 or substrate 18, respectively. In addition or alternatively, the wafer 16 can be held by a supported member 68. At least fixture 66 may provide a seal around the wafer 16 so that air does not move around the edge or side 16*a* of the wafer 16. As air moves through the holes, the wafer 16 may separate or disconnect from the supporting substrate 18. The fixture 66 and/or supporting member 68 may hold the wafer 16 steady as the wafer 16 is separated from the supporting substrate 18 (e.g., so that the wafer 16 does not "pop" off the supporting substrate 18).

In another embodiment, the wafer 16 and substrate 18 can be separated by a pressure differential. The wafer 16 and substrate 18 may separate two closed chambers (not shown) (i.e., positioned between two chambers), one chamber may be at a higher pressure than the other chamber. The pressure differential may be transmitted through one or more holes 20 in the substrate 18 to the interface 52 between the wafer 16 and supporting substrate 18. The pressure may provide the force necessary to separate/detach the wafer 16 and the substrate 18. In another embodiment, separation of the wafer 16 and the supporting substrate 18 may be initiated from the edge or side 70 of the resultant structure 54 by a mechanical means (e.g., a razor blade type device) or a fine jet of gas or liquid. In such an embodiment, the wafer 16 and supporting substrate 18 can be separated/pulled apart by providing suction to at least one of the wafer 16 or supporting substrate 18.

In other embodiments, no etchant may be used and pressurized gas may be used to apply forces on the wafer 16 through the holes 20 to separate the wafer 16 from the supporting substrate 18. In yet another embodiment, a gaseous or liquid etchant can be put under pressure to etch the interface 52 as well exert the necessary forces to separate the wafer 16 from the supporting substrate 18 so that a secondary loosening agent 60 is unnecessary.

As shown in FIG. 7, one or more holes 20 can each have depression 63. Depression 63 can allow more loosening agent 60 to contact the interface 52. The depression 63 can be larger than the dimension of the holes 20 and can be the same or different shape as the holes 20. In one embodiment, the depression 63 can be between about 1.5 and 5 times larger than the holes. Such a configuration increases the surface area of the interface 52 which is exposed to the loosening agent 60 while, at the same time, providing enough surface area to hold the wafer 16 so that the wafer 16 does not break, become damaged or detach from the supporting substrate 18. In another embodiment, one or more curvaceous or linear depression channels radiate outwardly from a hole wherein the channels direct loosening agent 60 to contact interface 52. The particular shape and size of these channels may depend on the desired bond strength between the wafer 16 and substrate 18. Generally, the total area covered by these channels is between about 5% and about 25% of total wafer 16—substrate 18 bonding surface.

Before or after the wafer 16 and supporting substrate 18 are separated, they be rinsed and dried to remove any contaminants such as dust, etchant, etc. from the resultant structure 54.

After detachment, the supporting substrate 18 may be recycled and reused for processing another wafer 16. In one embodiment, after separation of the wafer 16 and the substrate 18, all oxide may be stripped from the substrate 18. The substrate 18 may then be reoxidized and joined/bonded/connected to another wafer 16. The substrate 18 may be recycled or reused for multiple wafers 16. Removing the oxide and reoxidizing may be useful to prevent contamination (e.g., particles, metals) that may be present in or on the substrate 18. If the substrate 18 is not stripped of oxide between uses, contaminants may propagate and/or accumulate during the reuse of the substrate 18.

Figure 10:
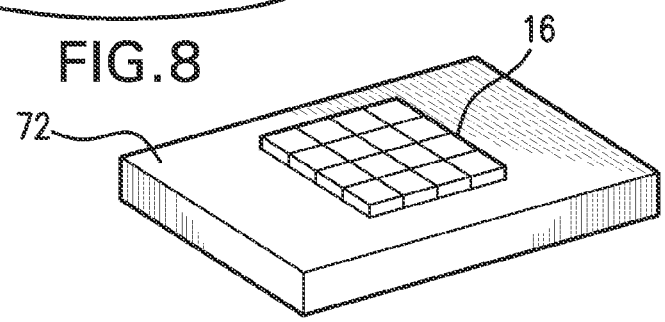
FIG. 10 is a perspective view of a portion of the processed wafer of FIG. 8 positioned on a holding member.
Figure 11:
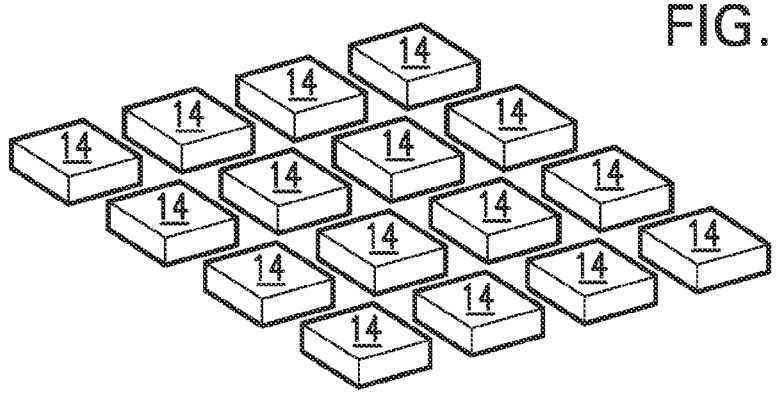
FIG. 11 is a perspective view of exemplary devices formed from the processed wafer of FIG. 8.
Figure 12:
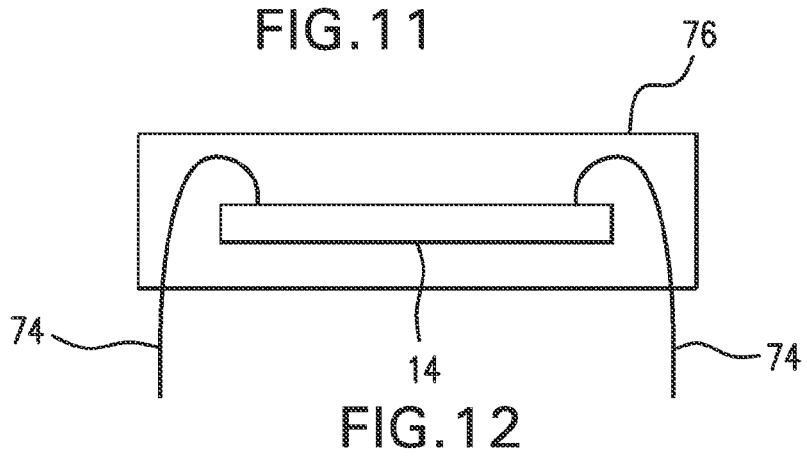
FIG. 12 is a cross-sectional view of a device of FIG. 11 in an operational housing.

A fully processed wafer 16, after being detached from the supporting substrate 16, can be placed on a holding member 72 such as an elastic plate (FIG. 10) and cut into die or separate devices 14 as shown in FIG. 11. As shown in FIG. 12, one or more connection members 74 can then be operably associated with the device 14 and the device 14 can be positioned in a housing 76 which may be made of, for example, plastic.

While the foregoing description and drawings represent a preferred embodiment of the present invention, it will be understood that various additions, modifications and substitutions can be made therein without departing from the spirit and scope of the present invention as defined in the accompanying claims. In particular, it will be clear to those skilled in the art that the present invention can be embodied in other specific forms, structures, arrangements, proportions, and with other elements, materials, and components, without departing from the spirit or essential characteristics thereof. One skilled in the art will appreciate that the present invention can be used with many modifications of structure, arrangement, proportions, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. A method for forming a device wafer with a recyclable support comprising:
providing a wafer having first and second surfaces, with at least the first surface of the wafer comprising a semiconductor material that is suitable for receiving or forming electronic devices thereon;
providing a supporting substrate having upper and lower surfaces;
selecting the wafer and supporting substrates to have thicknesses to provide the construct thickness to be about 650 to 1000 microns, with constructs that have a diameter of 200 mm having a minimum thickness of approximately 725 μm, constructs that have a diameter of 300 mm having a minimum thickness of approximately 775 μm, and constructs that have a diameter of 450 mm having a minimum thickness of approximately 800 μm;
providing the second surface of the wafer or the upper surface of the supporting substrate with void features in an amount sufficient to enable a connecting bond to form at an interface between the wafer and the substrate;
forming the connecting bond at the interface between the second surface of the wafer and the upper surface of the supporting substrate to form a construct, wherein the connecting bond is suitable to maintain the wafer and supporting substrate in association while forming or applying electronic devices to the first surface of the wafer while the construct has a thickness sufficient to withstand such forming or applying steps without breaking or being damaged, but wherein the connecting bond is severable at the interface due to the void features to separate the substrate from the wafer so that the substrate can be reused.

2. The method of claim 1, wherein the void features include a plurality of holes having diameters between about 25 microns and about 100 microns.

3. The method of claim 2, wherein the holes are separated from each other by a distance of between about 100 microns and about 1 mm.

4. The method of claim 2, wherein the holes are formed by selective etching of the substrate.

5. The method of claim 4, wherein the selective etching comprises dry etching.

6. The method of claim 2, which further comprises applying at least one loosening agent through the holes to weaken the connecting bond between the wafer and substrate.

7. The method of claim 6, wherein the loosening agent is an acid or gas applied in a quantity sufficient to deteriorate the connecting bond to assist in the separation of the wafer from the substrate.

8. The method of claim 6, which further comprises coating the supporting substrate with a thin layer of material after providing the holes therein to prevent premature loosening or separation during device fabrication.

9. A method for forming a device wafer with a recyclable support comprising:
providing a wafer having first and second surfaces, with at least the first surface of the wafer comprising a semiconductor material that is suitable for receiving or forming electronic devices thereon;
providing a supporting substrate having upper and lower surfaces;
providing the second surface of the wafer or the upper surface of the supporting substrate with void features, wherein the void features are provided by forming a plurality of holes through the supporting substrate in an amount sufficient to enable a connecting bond therebetween to form a construct wherein the bond is formed at an interface between the wafer and the substrate and is suitable to maintain the wafer and supporting substrate in association while forming or applying electronic devices to the first surface of the wafer, but which connecting bond is severable at the interface due to the plurality of holes to separate the substrate from the wafer, wherein the plurality of holes are configured to receive at least one loosening agent therethrough for weakening the connecting bond between the wafer and the substrate at the interface;

coating the supporting substrate with a layer of material after providing the holes therein to prevent premature loosening or separation during device fabrication; and etching the coating prior to applying the loosening agent.

10. A method for forming a device wafer with a recyclable support which comprises:

providing a wafer having first and second surfaces, with at least the first surface of the wafer comprising a semiconductor material that is suitable for receiving or forming electronic devices thereon;

providing a supporting substrate having upper and lower surfaces;

providing the second surface of the wafer or the upper surface of the supporting substrate with a plurality of holes through the supporting substrate, wherein the plurality of holes have diameters between about 25 microns and about 100 microns, are provided in an amount sufficient to enable a connecting bond to form at an interface between the wafer and the substrate, and are configured to receive at least one loosening agent therethrough for weakening the connecting bond between the wafer and the substrate at the interface;

forming the connecting bond at the interface between the second surface of the wafer and the upper surface of the supporting substrate to form a construct, wherein the connecting bond is suitable to maintain the wafer and supporting substrate in association while forming or applying electronic devices to the first surface of the wafer but is severable at the interface due to the void features provided; and thereafter holding the construct and applying a pressure differential to the interface through the holes of the substrate in an amount sufficient to detach and separate the wafer from the supporting substrate so that the substrate can be reused.

11. The method of claim 1 wherein the void features are provided by forming depressions in the upper surface of the supporting substrate or on the second surface of the wafer prior to forming the connecting bond therebetween.

12. The method of claim 11 wherein the depressions are formed by etching.

13. The method of claim 1 wherein the void features are provided by forming bumps on the upper surface of the substrate or the second surface of the wafer prior to forming the connecting bond therebetween, with the void features comprising portions adjacent the bumps.

14. The method of claim 13 wherein the bumps are formed by epitaxial deposition.

15. The method of claim 13 wherein the bumps are formed by oxidizing the second surface of the wafer or the upper surface of the supporting substrate.

16. The method of claim 1 which further comprises applying mechanical forces to pull apart and separate the wafer and supporting substrate.

17. The method of claim 15 wherein the mechanical forces are applied by a mechanical device that includes a blade, or by a jet of gas or liquid.

18. A method for forming a device wafer with a recyclable support which comprises:

providing a wafer having first and second surfaces, with at least the first surface of the wafer comprising a semiconductor material that is suitable for receiving or forming electronic devices thereon;

providing a supporting substrate having upper and lower surfaces;

providing the second surface of the wafer or the upper surface of the supporting substrate with a plurality of holes through the supporting substrate, wherein the plurality of holes have diameters between about 25 microns and about 100 microns, are provided in an amount sufficient to enable a connecting bond to form at an interface between the wafer and the substrate, and are configured to receive at least one loosening agent therethrough for weakening the connecting bond between the wafer and the substrate at the interface;

forming the connecting bond at the interface between the second surface of the wafer and the upper surface of the supporting substrate to form a construct, wherein the connecting bond is suitable to maintain the wafer and supporting substrate in association while forming or applying electronic devices to the first surface of the wafer but is severable at the interface due to the void features provided;

positioning the wafer and substrate in a vacuum to further weaken the connecting bond between the wafer and the substrate at the interface; and severing the connecting bond at the interface to detach and separate the substrate from the wafer so that the substrate can be reused.

19. The method of claim 1 wherein the wafer is a SOI wafer.

20. The method of claim 1 which further comprises forming or applying electronic devices or components to form electronic devices on the first surface of the wafer prior to separating the wafer from the supporting substrate.

21. The method of claim 20 which further comprises separating the wafer from the substrate and, thereafter, cutting the wafer into a plurality of pieces.

22. The method of claim 20 which further comprises separating the wafer from the supporting substrate for recycling and re-use for supporting another wafer.

23. The method of claim 20, which further comprises removing oxides from the upper surface of the separated supporting substrate; reoxidizing that surface of the substrate to form void features thereon; and connecting the supporting substrate to another wafer.

24. The method of claim 1, wherein the construct is formed to have a thickness which is substantially the same as the thickness of a standard wafer of the same diameter as the construct so that the construct can be processed in machines designed to hold standard wafers.

25. The method of claim 9 which further comprises:

forming or applying electronic devices or components to form electronic devices on the first surface of the wafer prior to separating the wafer from the supporting substrate;

applying at least one loosening agent through the holes to weaken the connecting bond between the wafer and substrate;

severing the connecting bond at the interface to separate the substrate from the wafer so that the substrate can be reused; and thereafter, cutting the wafer into a plurality of pieces.

26. The method of claim 9, wherein the plurality of holes have diameters between about 25 microns and about 100 microns.

27. The method of claim 26, wherein the holes are separated from each other by a distance of between about 100 microns and about 1 mm.

28. The method of claim 26, wherein the holes are formed by selective etching of the substrate.

29. The method of claim 28, wherein the selective etching comprises dry etching.

30. The method of claim 26, which further comprises applying at least one loosening agent through the holes to weaken the connecting bond between the wafer and substrate.

31. The method of claim 30, wherein the loosening agent is an acid or gas applied in a quantity sufficient to deteriorate the connecting bond to assist in the separation of the wafer from the substrate.

32. The method of claim 30, which further comprises coating the supporting substrate with a thin layer of material after providing the holes therein to prevent premature loosening or separation during device fabrication.

* * * * *

UNITED STATES PATENT AND TRADEMARK OFFICE
CERTIFICATE OF CORRECTION

PATENT NO. : 7,605,054 B2  Page 1 of 1
APPLICATION NO. : 11/736809
DATED : October 20, 2009
INVENTOR(S) : Celler It is certified that error appears in the above-identified patent and that said Letters Patent is hereby corrected as shown below:

Column 12:
Line 64 (claim 25, line 12), change "cuffing" to -- cutting --.

Signed and Sealed this

Twenty-fourth Day of November, 2009

David J. Kappos
*Director of the United States Patent and Trademark Office*